United States Patent [19]
Philippe

[11] Patent Number: 5,043,654
[45] Date of Patent: Aug. 27, 1991

[54] PHASE SHIFTER HAVING PARALLEL RC NETWORKS

[75] Inventor: Pascal Philippe, Paris, France

[73] Assignee: U.S. Philips Corp., New York, N.Y.

[21] Appl. No.: 534,100

[22] Filed: Jun. 6, 1990

[30] Foreign Application Priority Data

Jun. 6, 1989 [FR] France ................................ 89 07441

[51] Int. Cl.⁵ .............................................. G05F 3/00
[52] U.S. Cl. ..................................... 323/219; 323/218
[58] Field of Search ................ 323/212, 218, 219, 213; 363/156

[56] References Cited

U.S. PATENT DOCUMENTS

| | | | |
|---|---|---|---|
| 3,267,358 | 8/1966 | Anderson | 323/218 |
| 3,267,359 | 8/1966 | Anderson | 323/218 |
| 3,544,886 | 12/1970 | Hou et al. | 323/219 |
| 4,725,767 | 2/1988 | Mori | 323/218 |

OTHER PUBLICATIONS

Johnson, *Active Constant-Gain Variable Phase-Shift Network*, IBM Technical Bulletin, vol. 13, No. 1, Jun. 1970, pp. 182, 183.

Primary Examiner—Peter S. Wong
Assistant Examiner—B. Davidson
Attorney, Agent, or Firm—Steven R. Biren

[57] ABSTRACT

Phase shifter to which are applied two signals in a phase opposition ($v$, $-v$) is constituted by a first series circuit of a resistor and a capacitor ($R_1$, $C_1$), and a second series circuit of a resistor and a capacitor ($R_2$, $C_2$). So that neither the relative amplitudes nor the relative phases of all the signals used at the outputs (5, 6, 7, 8) are degraded by the impedance of the stages that follow, the phase shifter includes a first network of a resistor and a capacitor connected in parallel ($C_3$, $R_3$), and a second network of a resistor and a capacitor connected in parallel ($C_4$, $R_4$). Both the four resistors and the four capacitors of the phase shifter are each substantially equal in value.

5 Claims, 1 Drawing Sheet

PHASE SHIFTER HAVING PARALLEL RC NETWORKS

BACKGROUND OF THE INVENTION

The present invention relates to a phase shifter, having first and second input terminals for receiving two signals in phase opposition, and having first and second output terminals intended to produce signals shifted in phase relative to the input signals, the shifter comprising a first series circuit of a resistor and a capacitor connected between the input terminals, the first circuit in which the resistor is connected to the first input terminal and a junction point between the resistor and the capacitor being connected to the first output terminal, and comprising a second series circuit of a resistor and a capacitor connected between the input terminals, the second circuit in which the resistor is connected to the second input terminal and a junction point between the resistor and the capacitor being connected to the second output terminal.

The applications of such a phase shifter are varied in the field of electronics: one may mention, more specifically, the so-called Single Side Band (SSB) radio transceivers, phase modulators having four states or multiples thereof, and scanning antennas.

A phase shifter of this type is known from U.S. Pat. No. 3,544,886. This document explains that the input impedance of the stages following the phase shift circuit is to be high, and the circuit of this document thereto comprises an adapted amplifier which takes over the output signal. Furthermore, the circuit described by this document does not comprise output terminals for relaying the input signals at the output. These signals would nevertheless be available at the points referenced a and b in the Figures of said document, but the same problem would be posed in this respect concerning the input impedance of the stages that follow. In addition, if the input impedance of the stages that follow similarly changed the two signals called "output signals", it would change the phase and amplitude of the signals called "input signals" differently.

SUMMARY OF THE INVENTION

The invention has for its object to provide a phase shifter of which neither the relative amplitudes nor the phases of all the signals used at the output are degraded by the impedance of the stages that follow, provided that these stages all have the same impedance.

For this purpose, the phase shifter according to the invention further includes a first network of a parallel third resistor and third capacitor, whose one end is connected to the first input terminal, and whose other end constitutes a third output terminal, and includes a second network of a parallel fourth resistor and fourth capacitor, whose one end is connected to the second input terminal and whose other end is connected to a fourth output terminal.

Thus, the shifter has output terminals whose relative phases and amplitudes, with respect to the outputs of the phase-shifted signals, are not changed even if the impedances of the stages that follow are moderate, because all phases are then changed by an equal amount, and the same holds for the amplitudes.

In order to achieve that the relative phase shifts at the four output terminals are equal to respectively 0°, 180°, $\phi$, and $\phi+180°$, values which are often desired, the four resistors of the shifter are mutually equal and the four capacitors are mutually equal, at least as regards their nominal value.

In the case when the frequency of the signals to be processed is fixed, each resistor is advantageously adjusted to compensate for the difference with respect to the nominal value of the capacitor associated thereto, in order to obtain the necessary RC product. Conversely, if the frequency of the signals is variable, either the four resistors or the four capacitors are together adjustable by means of a single controller. In an advantageous simplified version either the two resistors or the two capacitors of the series circuits are together adjustable by means of a single controller, and the elements of the parallel networks are fixed.

BRIEF DESCRIPTION OF THE DRAWING

The following description, referring to the annexed drawing Figures depicting non-limiting examples, will make it better understood how the invention can be realized, in the drawing.

DESCRIPTION OF THE PREFERRED EMBODIMENT

In thep particular case when a phase shifter is used in a SSB receiver presenting image frequency rejection, the shifter is used for producing a signal having phase $\phi$ necessary for image frequency rejection.

For certain arrangements it is necessary to have four signals having the phases 0°, 90°, 180° and 270°.

Figure 1:
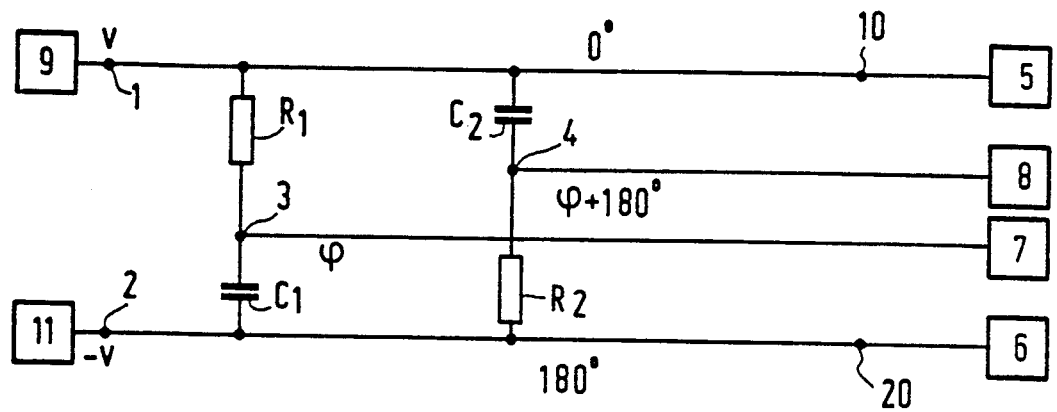
FIG. 1 is a prior-art circuit diagram.

The phase shifter of FIG. 1 comprises a series circuit of $R_1$ and $C_1$ having a variable impedance (variation of $R_1$ or $C_1$), fed at its ends by the signals v, −v applied in phase opposition to the input terminals 1, 2. A second circuit $R_2$, $C_2$ oppositely arranged with respect to the first, enables to obtain the phase $\phi+180°$. Such an arrangement is frequently used for generating a signal having a constant amplitude and a variable phase $\phi$.

If this circuit is used for single sideband modulation (SSB) in a receiver presenting image frequency rejection, the fact that the amplitude of the 0° and 90° signals is equal is as important for obtaining a high rejection as is the phase accuracy. For example, with a 0.5 dB amplitude difference, the rejection is limited to 30 dB. In this field of application (SSB transceivers), the invention is thus particularly interesting.

In such an papplication four phases are necessary 0° and 180°, $\phi$ and $\phi+180°$. The difference signal 0/180° is used as a phase reference for the difference signal $\phi/\phi+180°$. In this case all signals are desired to have equal amplitudes. Unfortunately, the stages 5, 6, 7, 8 that follow and tap these signals at the terminals , 3, 4, 10, 20 present non-zero input admittance $Yin = Gin + j\omega Cin$ which affect the relative amplitudes of the signals. In effect, the signal at the outputs $\phi$ and $\phi+180°$ (terminals 3, 4), is combined with the signal 0/180° (terminals 10, 20) having an amplitude v by means of the equation:

$$x_\phi = \pm \frac{G - j\omega C}{(G + Gin) + j\omega(C + Cin)} v$$

The signal is thus attenuated at the outputs $\phi$ and $\phi+180°$ because the modulus of the transfer function is less than 1. In order to bring this attenuation back to a reasonable value ($\leq 1$ dB) it is necessary that $G \geq 10$ Gin and $C \geq 10$ Cin which requires the use of a stage having a very high impedance and/or a RC circuit having a low impedance. However, the impedance of the RC circuit also has to be high compared to the output impedance of the stages 9, 11 which generate the reference signals v, −v (0, 180°), if the amplitude of the signals is desired to vary little with frequency and/or phase $\phi$. One thus has to reach the following compromise:

$$Zout << R + \frac{1}{j\omega C} << Zin$$

where
Zout is the output impedance of the stages 9, 11 and
Zin is the input impedance of the stages 5-8.

This compromise is very constraining and the phase shifter according to the invention enables to remove the need for a load stage having a high input impedance to preserve the same signal amplitude.

Figure 2:
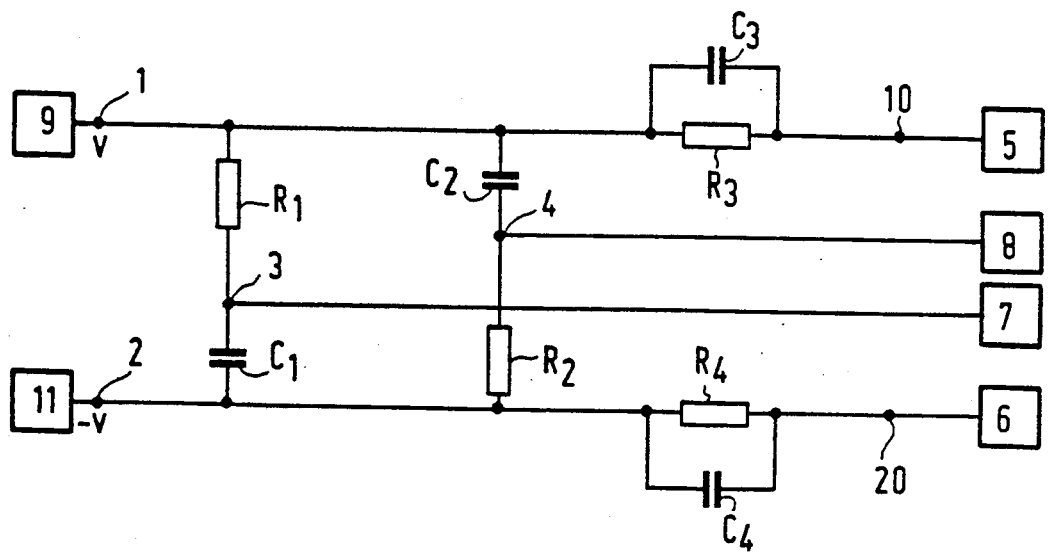
FIG. 2 is a circuit diagram according to the invention.

In the circuit represented in FIG. 2, a parallel RC network $R_3$, $C_3$ or $R_4$, $C_4$ is extended to the previous circuit, connected in series in each of the 0° and 180° paths, that is to say, between the input terminals 1, 2 always connected to two serial circuits $R_1$, $C_1$ and $R_2$, $C_2$, and the output terminals 10, 20.

The resistors and the capacitors of these parallel networks $R_3$, $C_3$ and $R_4$, $C_4$ have the same value as in the serial phase shift circuits $R_1C_1$ and $R_2C_2$. In proportion to the differential input signal having an amplitude v, the 0/180° output signal (terminals 10, 20) is given by:

$$v_{0°/180°} = \pm \frac{G + j\omega C}{(G + Gin) + j\omega(C + Cin)}$$

and the output signal $\phi/\phi + 180°$ (terminals 3, 4) is given by:

$$v_{\phi/\phi+180°} = \pm \frac{G - j\omega C}{(G + Gin) + j\omega(C + Cin)}$$

The amplitude at the four output terminals 3, 4, 10, 20 is the same whatever the frequency, the phase shift introduced by the RC networks, and the input impedance of the load stages 5-8.

In this manner an almost perfect compensation has been realized for which it is no longer necessary to use at all cost a load stage having a high impedance. The effect of the load impedance is only equal to the attenuation of the four output signals of the system, that is to say, provided that the capacitors, if not of a high value, are mutually equal, at least as regards the nominal value. The rejection level which may be attained in the SSB receiver depends on permissible tolerances for all the components.

If in a particular case a circuit of this type were used for obtaining a fixed phase shift at a fixed frequency, it would be advantageous realize integrated resistors and discrete capacitors on the same substrate in so-called hybrid circuit technology. The value of each resistor can then be adjusted (for example, by means of a laser) as a function of the capacitor connected thereto, thus compensating for any error in the nominal value of the latter.

On the other hand, when the frequency or rather the desired phase shift varies, it is necessary that either R or C can be varied. The preferred method consists of making either the four resistors or the four capacitors vary be means of a single controller, in order to maintain all the RC products which are mutually equal.

In practice, one may also reach an interesting compromise by choosing for $R_3$, $C_3$, $R_4$, $C_4$ fixed values, almost corresponding to the value necessary in the middle of the frequency range or the range of the variation of $\phi$, and by making only $R_1$ and $R_2$, or $C_1$ and $C_2$ vary by means of a single controller.

When particularly used in a SSB receiver for frequencies of the order of 1 to 5 GHz, the stages 5 to 8, 9, 11 are realized by means of MESFET transistors on a Gallium Arsenide substrate. The resistors $R_1$ to $R_4$ are each constituted by a MESFET transistor used as a variable resistor. These transistors all have the same value and are together controlled by a variable common gate bias voltage intended to make their dynamic resistance vary as desired. For the indicated frequencies, the transistors may have, for example, a gate width of approximately 10μm, and the (integrated) capacitors have a value of 0.1 pF. In the output stages 5 and 6, the signal input is the gate of a MESFET transistor.

When used at a lower frequency, variable capacitors could also be used, for example realized by means of variable capacitance diodes, all controlled by a single bias voltage, while the resistors then have fixed values.

I claim:

1. A phase shifter, having first and second input terminals for receiving two signals in phase opposition, and having first and second output terminals intended to produce signals shifted in phase relative to the input signals, the shifter comprising a first series circuit of a resistor and a capacitor connected between the input terminals, in which the resistor is connected to the first input terminal and a junction point between the resistor and the capacitor is connected to the first output terminal, and comprising a second series circuit of a resistor and a capacitor connected between the input terminals, in which the resistor is connected to the second input terminal and a junction point between the resistor and the capacitor is connected to the second output terminal, characterized in that the phase shifter includes a first parallel network of a parallel resistor and capacitor, which first parallel network is inserted between the first input terminal and a third output terminal, and includes a second parallel network of a parallel resistor and capacitor, which second parallel network is inserted between the second input terminal and a fourth output terminal.

2. A phase shifter as claimed in claim 1, characterized in that all of the resistors in said phase shifter and all of the capacitors in said phase shifter, respectively, have substantially a same nominal value.

3. A phase shifter as claimed in claim 2, characterized in that each resistor is adjusted to compensate for the difference with respect to the nominal value of the capacitor associated therewith, in order to obtain a constant RC product for each resistor and its associated capacitor.

4. A phase shifter as claimed in claim 1 or 2, for use when a variable signal frequency is applied, characterized in that either all of the resistors in said phase shifter or all of the capacitors in said phase shifter are simultaneously adjustable.

5. A phase shifter as claimed in claim 1 or 2, for use when a variable signal frequency is applied, characterized in that either the resistors or the capacitors of the first and second series circuits are simultaneously adjustable, and the elements of the parallel networks have fixed values.

* * * * *